(12) United States Patent
Mishra et al.

(10) Patent No.: US 12,193,111 B2
(45) Date of Patent: Jan. 7, 2025

(54) METHODS AND SYSTEMS FOR MANAGING DECODING OF CONTROL CHANNELS ON A MULTI-SIM UE

(71) Applicant: Samsung Electronics Co., Ltd., Suwon-si (KR)

(72) Inventors: Samir Kumar Mishra, Bangalore (IN); Sarvesha Anegundi Ganapathi, Bangalore (IN)

(73) Assignee: Samsung Electronics Co., Ltd., Gyconggi-do (KR)

( * ) Notice: Subject to any disclaimer, the term of this patent is extended or adjusted under 35 U.S.C. 154(b) by 0 days.

(21) Appl. No.: 18/157,641

(22) Filed: Jan. 20, 2023

(65) Prior Publication Data

US 2023/0156456 A1    May 18, 2023

Related U.S. Application Data

(63) Continuation of application No. 17/068,345, filed on Oct. 12, 2020, now Pat. No. 11,582,594.

(30) Foreign Application Priority Data

Oct. 9, 2020 (IN) .............................. 201941041277
Oct. 11, 2020 (IN) ............................. 201941041277

(51) Int. Cl.
*H04W 8/00* (2009.01)
*H03M 13/11* (2006.01)
(Continued)

(52) U.S. Cl.
CPC ....... *H04W 8/183* (2013.01); *H03M 13/1148* (2013.01); *H03M 13/3927* (2013.01);
(Continued)

(58) Field of Classification Search
CPC ..... H04W 8/183; H04W 8/205; H04W 88/06; H03M 13/1148; H03M 13/3927; H03M 13/3972
(Continued)

(56) References Cited

U.S. PATENT DOCUMENTS 9,313,109 B1 * 4/2016 Majumder ........... H04B 17/382
9,402,193 B2    7/2016 Sampath et al.
(Continued)

FOREIGN PATENT DOCUMENTS

CN    101184290 A    5/2008
CN    101217812 A    7/2008
(Continued)

OTHER PUBLICATIONS

E. Arikan, "Polar codes: A pipelined implementation," Proc. 4th ISBC, pp. 11-14, 2010.
(Continued)

*Primary Examiner* — April G Gonzales
(74) *Attorney, Agent, or Firm* — Harness, Dickey & Pierce, P.L.C.

(57) ABSTRACT

Methods and systems for managing decoding of control channel on a multi-SIM UE. A method includes receiving, by the UE, the plurality of control channels from at least one Base Station (BS), the plurality of control channels corresponding to a plurality of Subscriber Identity Modules (SIMs), selecting, by the UE, a respective decoder for each of the plurality of SIMS, and decoding, by the UE, each respective control channel among the plurality of control channels using the respective decoder for a respective SIM among the plurality of SIMS, the respective SIM corresponding to the respective control channel.

20 Claims, 7 Drawing Sheets

(51) Int. Cl.
  *H03M 13/39* (2006.01)
  *H04W 8/18* (2009.01)
  *H04W 8/20* (2009.01)
  *H04W 88/06* (2009.01)
(52) U.S. Cl.
  CPC ....... *H03M 13/3972* (2013.01); *H04W 8/205* (2013.01); *H04W 88/06* (2013.01)
(58) Field of Classification Search
  USPC .......................................................... 455/73
  See application file for complete search history.

(56) References Cited

U.S. PATENT DOCUMENTS

| | | | | |
|---|---|---|---|---|
| 10,447,435 | B2* | 10/2019 | Shi | H04L 1/0045 |
| 11,201,773 | B1* | 12/2021 | Zach | H04L 1/0004 |
| 11,277,152 | B2* | 3/2022 | Jeong | H03M 13/2778 |
| 2011/0292854 | A1* | 12/2011 | Terry | H04L 5/0098 |
| | | | | 370/329 |
| 2012/0233696 | A1* | 9/2012 | Zeng | H04W 12/128 |
| | | | | 726/24 |
| 2013/0148574 | A1* | 6/2013 | Liu | H04W 36/005 |
| | | | | 370/328 |
| 2013/0150013 | A1* | 6/2013 | Liu | H04W 8/183 |
| | | | | 455/418 |
| 2013/0150014 | A1* | 6/2013 | Gong | H04W 48/18 |
| | | | | 455/418 |
| 2013/0150032 | A1* | 6/2013 | Pattaswamy | H04W 52/0229 |
| | | | | 455/434 |
| 2013/0150036 | A1* | 6/2013 | Pattaswamy | H04W 76/15 |
| | | | | 455/435.1 |
| 2013/0150126 | A1* | 6/2013 | Pattaswamy | H04W 76/34 |
| | | | | 455/558 |
| 2013/0316764 | A1* | 11/2013 | Mehio | H04W 8/183 |
| | | | | 455/558 |
| 2013/0336255 | A1* | 12/2013 | Gupta | H04W 28/06 |
| | | | | 370/328 |
| 2014/0086063 | A1* | 3/2014 | Wu | H04W 24/00 |
| | | | | 370/241 |
| 2014/0119345 | A1* | 5/2014 | Sikri | H04W 72/12 |
| | | | | 370/336 |
| 2015/0033098 | A1* | 1/2015 | Chui | H03M 13/37 |
| | | | | 714/776 |
| 2015/0098445 | A1* | 4/2015 | Chakravarthy | H04W 76/15 |
| | | | | 370/331 |
| 2016/0014578 | A1* | 1/2016 | Kadiyala | H04W 4/06 |
| | | | | 455/414.1 |
| 2016/0014579 | A1* | 1/2016 | Kasilya Sudarsan | |
| | | | | H04W 76/15 |
| | | | | 455/553.1 |
| 2017/0019921 | A1* | 1/2017 | Hsu | H04L 1/1678 |
| 2017/0311284 | A1* | 10/2017 | Basu Mallick | H04W 68/02 |
| 2018/0176059 | A1* | 6/2018 | Medles | H04W 72/54 |
| 2020/0084814 | A1* | 3/2020 | Lindoff | H04W 64/00 |
| 2020/0212936 | A1* | 7/2020 | Maunder | H03M 13/6577 |
| 2021/0112398 | A1* | 4/2021 | Mishra | H04W 8/205 |
| 2022/0140945 | A1* | 5/2022 | Hong | H04L 1/0064 |
| | | | | 714/752 |

FOREIGN PATENT DOCUMENTS

| | | |
|---|---|---|
| CN | 102356658 A | 2/2012 |
| CN | 103378942 A | 10/2013 |
| CN | 107852288 A | 3/2018 |
| CN | 108702239 A | 10/2018 |

OTHER PUBLICATIONS

Doan N, Hashemi SA, Mondelli M, Gross WJ. On the decoding of polar codes on permuted factor graphs. In2018 IEEE Global Communications Conference (Globecom) Dec. 9, 2018 (pp. 1-6). IEEE.
Elkelesh A, Ebada M, Cammerer S, ten Brink S. Belief propagation decoding of polar codes on permuted factor graphs. In2018 IEEE Wireless Communications and Networking Conference (WCNC) Apr. 15, 2018 (pp. 1-6). IEEE.
Office action dated Mar. 28, 2022 for corresponding U.S. Appl. No. 17/068,345.
Notice of Allowance dated Oct. 13, 2022 for corresponding U.S. Appl. No. 17/068,345.
"3GPP TSG RAN WG1" Siemens (Feb. 2002) p. 1-72.
CN Office Action dated Sep. 11, 2023 for corresponding CN Patent Application No. 202011087823.4.

* cited by examiner

METHODS AND SYSTEMS FOR MANAGING DECODING OF CONTROL CHANNELS ON A MULTI-SIM UE

CROSS REFERENCE TO RELATED APPLICATION

The present application is a continuation of and claims priority under 35 U.S.C. § 120 to U.S. patent application Ser. No. 17/068,345, filed on Oct. 12, 2020, which claims priority under Indian Provisional Application 201941041277, filed on Oct. 11, 2019, and Indian Non-provisional Patent Application No. 201941041277, filed on Oct. 9, 2020, the contents of each of which are incorporated herein by reference.

TECHNICAL FIELD

The present disclosure relates to the field of User Equipments (UEs) supporting multiple Subscriber Identity Modules (multi-SIMS) and more particularly to managing decoding of control channels on a UE supporting multi-SIMS.

BACKGROUND

In a wireless communication system, a Base Station (BS) transmits data and Downlink Control Information (DCI) to a User Equipment (UE) through a data channel (for example: a Physical Downlink Shared Channel (PDSCH)), and a control channel (for example: a Physical Downlink Control Channel (PDCCH)), respectively. The DCI includes information such as, but not limited to, resource allocations, resource assignments on the PDSCH, uplink resource grants, and so on. The BS transmits the control channel prior to the data channel in a sub-frame transmitted to the UE. The BS encodes the control and data channels for the DCI and the data, respectively.

In conventional approaches, the UE may use a Successive Cancellation List (SCL) decoder for decoding the control channel and a Belief Propagation (BP) decoder for decoding the data channel. The BP decoder may decode the data channel, which is encoded using Low Density Parity Check (LDPC) codes, wherein the complexity for the BP decoder may be $0(n \log_2 n)$. The SCL decoder may decode the control channel, which is encoded using polar codes, wherein the complexity for the SCL decoder may be $0 (Ln \log_2 n)$, wherein 'n' is a code length and is a list size of the SCL decoder. However, the SCL decoder consumes higher area/space, and power, as the complexity of the SCL decoder depends on the list size, and the SCL decoder decodes the control channel using the polar codes in a serial manner.

Further, in the conventional approaches, the UE may support multiple-Subscriber Identity Modules (multi-SIMs)/Carrier Components (CCs) and include a single Radio Frequency (RF) chain and a single SCL decoder (which is part of modem hardware) for the multi-SIMS to conserve cost/space. In such a case, on receiving the control channels on the multi-SIMS, the UE may enable each SIM of the multi-SIMS to use the SCL decoder in a time multiplexed manner for decoding the control channels. However, decoding the control channels in a multiplexed manner consumes more time. Alternatively, the UE may support multi-SIMS/CCs and include multiple duplicate SCL decoders for the multi-SIMS/CCs. In such a case, on receiving the control channels on the multi-SIMS, the UE may use the multiple duplicate SCL decoders for decoding the control channels received on the multi-SIMS to avoid collision of the control channels. However, using the multiple duplicate SCL decoders may cost higher space, and higher power consumption due to its complexity.

In an example conventional receiver of a UE supporting dual SIMS, two SCL decoders are used for decoding control channels received respectively on the two SIMS. The UE may be a Dual SIM Dual Standby (DSDS) device, supporting two SIMS and RF chains for each of the two SIMS. Each RF chain includes an antenna, a RF front end section, a demodulator, a SCL decoder, and a BP decoder. On receiving the control channels on the two SIMS, the UE uses the SCL decoders to decode the control channels received on the two SIMS, thereby avoiding collision of the control channels. However, usage of the two duplicate SCL decoders may be expensive in terms of power consumption, and space. Further, the BP decoder may become idle during the decoding of the control channels. Thus, the conventional approaches involve inefficient usage of the decoders for decoding the control channels.

SUMMARY

Example embodiments herein provide methods and systems for managing decoding of control channels on a User Equipment (UE) supporting multiple Subscriber Identity Modules (multi-SIMs).

Example embodiments herein provide methods and systems for selecting a decoder for each SIM of the multi-SIMS for decoding the control channels, wherein the decoder is a Successive Cancellation List (SCL) decoder or a Belief Propagation (BP) decoder.

Example embodiments herein provide methods and systems for using at least one of channel quality metric, Log-Likelihood Ratios (LLRs), and Mean Mutual Information per Bit (MMIB) to select the decoder for each SIM.

Accordingly, example embodiments herein provide methods and systems for decoding control channels in a User Equipment (UE). A method disclosed herein includes receiving, by the UE, the plurality of control channels from at least one Base Station (BS), the plurality of control channels corresponding to a plurality of Subscriber Identity Modules (SIMs), selecting, by the UE, a respective decoder for each of the plurality of SIMS, and decoding, by the UE, each respective control channel among the plurality of control channels using the respective decoder for a respective SIM among the plurality of SIMs, the respective SIM corresponding to the respective control channel.

Accordingly, example embodiments herein provide a User Equipment (UE) comprising processing circuitry configured to receive a plurality of control channels from at least one Base Station (BS), the plurality of control channels corresponding to a plurality of Subscriber Identity Modules (SIMs), select a respective decoder for each of the plurality of SIMS, and decode each respective control channel among the plurality of control channels using the respective decoder for a respective SIM among the plurality of SIMs, the respective SIM corresponding to the respective control channel.

These and other aspects of example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of example embodiments herein without departing from the spirit thereof, and example embodiments herein include all such modifications.

BRIEF DESCRIPTION OF FIGURES

Example embodiments herein are illustrated in the accompanying drawings, throughout which like reference letters indicate corresponding parts in the various figures. Example embodiments herein will be better understood from the following description with reference to the drawings, in which.

DETAILED DESCRIPTION

Figure 1:
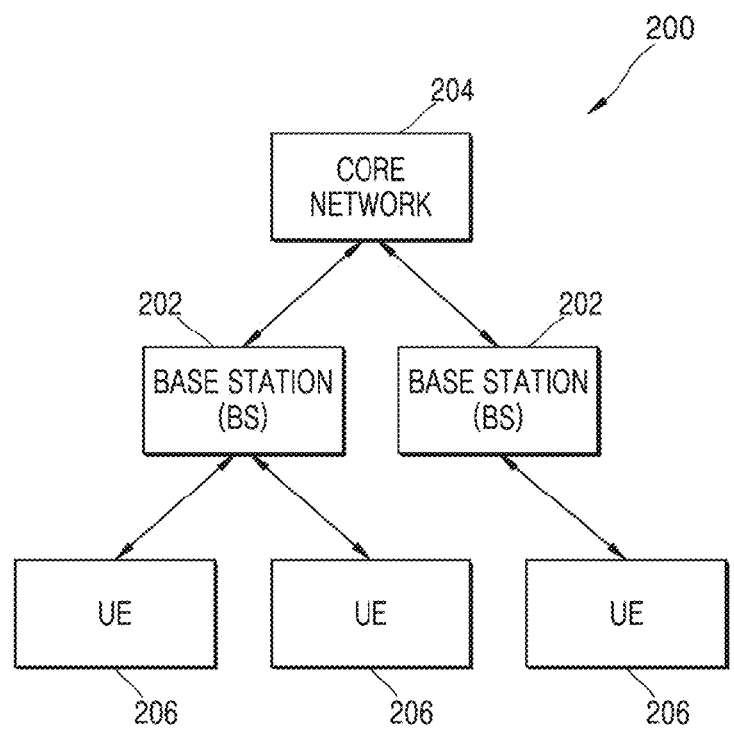
FIG. 1 depicts a wireless communication system, according to example embodiments as disclosed herein.

Example embodiments herein and the various features and advantageous details thereof are explained more fully with reference to example embodiments illustrated in the accompanying drawings and detailed in the following description. Descriptions of well-known components and processing techniques are omitted so as not to obscure example embodiments herein. The description herein is intended merely to facilitate an understanding of ways in which example embodiments herein may be practiced and to further enable those of skill in the art to practice example embodiments herein. Accordingly, this disclosure should not be construed as limiting the scope of example embodiments herein.

Example embodiments herein provide methods and systems for managing decoding of control channels on a User Equipment (UE) supporting multiple Subscriber Identity Modules (multi-SIMs).

Example embodiments herein provide methods and systems for selecting a decoder for each SIM of the multi-SIMS to decode the control channels received on the multi-SIMS, wherein the selected decoder is either a Successive Cancellation List (SCL) decoder or a Belief Propagation (BP) decoder.

Referring now to the drawings, and more particularly to FIGS. 1 through 5, where similar reference characters denote corresponding features consistently throughout the figures, there are shown example embodiments.

FIG. 1 depicts a wireless communication system 200, according to example embodiments as disclosed herein.

The wireless communication system 200 includes at least one Base Station (BS) 202 (also referred to herein as a BS/Radio Access Network (RAN)), at least one Core Network (CN) 204, and/or at least one UE 206. According to example embodiments, each of the at least one BS 202 may be the same as or similar to one another, each of the at least one CN 204 may be the same as or similar to one another, and/or each of the at least one UE 206 may be the same as or similar to one another. The at least one BS 202, the at least one CN 204 and/or the at least one UE 206 may be referred to in the singular or the plural herein.

The BS/Radio Access Network (RAN) 202 may be configured to communicate with the at least one UE 206. The BS 202 may comprise of one or more nodes such as, but not limited to, evolved nodes (eNBs), New Radio nodes (gNBs), and so on. In example embodiments herein, the BS 202 may communicate with the UE 206 via a same Radio Access Technology (RAT) or a similar RAT. In example embodiments herein, the BS 202 may communicate with the UE 206 via different Radio Access Technologies (RATs). Examples of the RAT may be, but are not limited to, a Third Generation Partnership Project (3GPP) 3rd Generation (3G) network, a Long Term Evolution (LTE/4G) network, an LTE-Advanced (LTE-A) network, a Fifth Generation (5G) New Radio (NR) network, a Wireless Local Area Network (WLAN), a Worldwide Interoperability for Microwave Access (WiMAX/IEEE 802.16) network, a Wi-Fi (IEEE 802.11) network, an Evolved-UTRA (E-UTRA) network, an LTE/4G communication system, a 5G/NR communication system, and/or any other next generation network. The BS 202 may transmit control signaling and/or data plane messages to the UE 206 in a downlink (DL) transmission. The BS 202 may receive the control signaling and/or the data plane messages from the UE 206 in an uplink (UL) transmission.

The BS 202 may also be configured to communicate with the CN 204 and to connect the UEs 206 to the CN 204. The CN 204 may be at least one of an Evolved Packet Core (EPC), a 5G core (5GC) network, and/or the like. The CN 204 may be configured to connect the UE 206 to an external data network for exchanging data. Examples of the external data network may be, but are not limited to, the Internet, a Packet Data Network (PDN), an Internet Protocol (IP) Multimedia Core Network Subsystem, and so on. Examples of the data may be, but are not limited to, text messages, media (for example; audio, video, images, data packets, and so on), sensor data, and so on. The BS 202 and the CN 204 may comprise of one or more processors/Central Processing Units (CPUs), a memory, a storage, a transceiver, and so on, for performing at least one intended function/operation.

The BS 202 may be configured to transmit control data and data for the UE 206 using the control channel and data channel respectively, wherein the control channel and the data channel may be encoded channels.

In example embodiments herein, the control channel may be a physical channel, which may carry Downlink Control Information (DCI), such as a Physical Downlink Control Channel (PDCCH). In an example, the DCI may indicate at least one of a resource block carrying data, a demodulation scheme for decoding the data, resource allocations, uplink resource grants, and so on. In example embodiments, the BS 202 may use polar codes for encoding the DCI over the control channel.

In example embodiments herein, the data channel may be a Physical Downlink Shared Channel (PDSCH), which carries the data for the UE 206. In example embodiments, the BS 202 may use Low Density Parity Check (LDPC) codes for encoding the data over the data channel.

The BS 202 may transmit the control channel to the UE 206, prior to transmitting the data channel to the UE 206. Transmission of the control channel and the data channel may vary depending on the RAT(s) supported by the BS 202. For example, if the BS 202 supports an LTE network (as an example of the RAT), the BS 202 may transmit a radio frame of 10 milliseconds (ms) duration to the UE 206. Each radio frame may include sub frames, which may be of 1 ms duration. Further, each subframe may be divided into two slots of 0.5 ms duration each. A first slot may carry the control channel, and a second slot may carry the data channel.

The UE(s) 206 may be a user device that may support reception of the control channel and the data channel. Examples of the UE 206 may be, but are not limited to, a mobile phone, a smartphone, a tablet, a phablet, a Personal Digital Assistant (PDA), a laptop, a computer, a wearable computing device, a vehicle infotainment device, an Internet of Things (IoT) device, a Virtual Reality (VR) device, a Wireless Fidelity (Wi-Fi) router, a Universal Serial Bus (USB) dongle, an auto-guided vehicle, and/or any other device that supports the reception of the control and data channels.

In example embodiments, the UE 206 may be a multi-Subscriber Identity Module (SIM) (MUSIM) device, which supports multiple-SIMS/stacks (multi-SIMs or multi-stacks) of different RATs for establishing communication with the wireless communication system 200 (e.g., the BS 202 and/or CN 204). The multi-SIMS may be operated by the same service provider, similar service providers or different service providers. In an example, the communication may refer to at least one of, but is not limited to, a call, (such as a voice call, data call, and/or the like), a data session, a text messaging session, and/or any other data transfer session.

In example embodiments, the UE 206 may support one or more SIMS and/or Carrier Aggregation (CA) scenarios. In the CA scenarios, the UE 206 may receive UL and DL resources from the BS 202 on an aggregated resource, which may comprise two or more Component Carriers (CC)/frequencies.

In example embodiments, the usage of the word 'SIM' may be synonymous with CC or frequency, or any other word which supports the reception of the data and control channels. Example embodiments herein may use the terms "SIM", "CC", "carrier frequency", and so on interchangeably to refer to a component using which the UE 206 receives the control and data channels from the BS 202.

Figure 3:
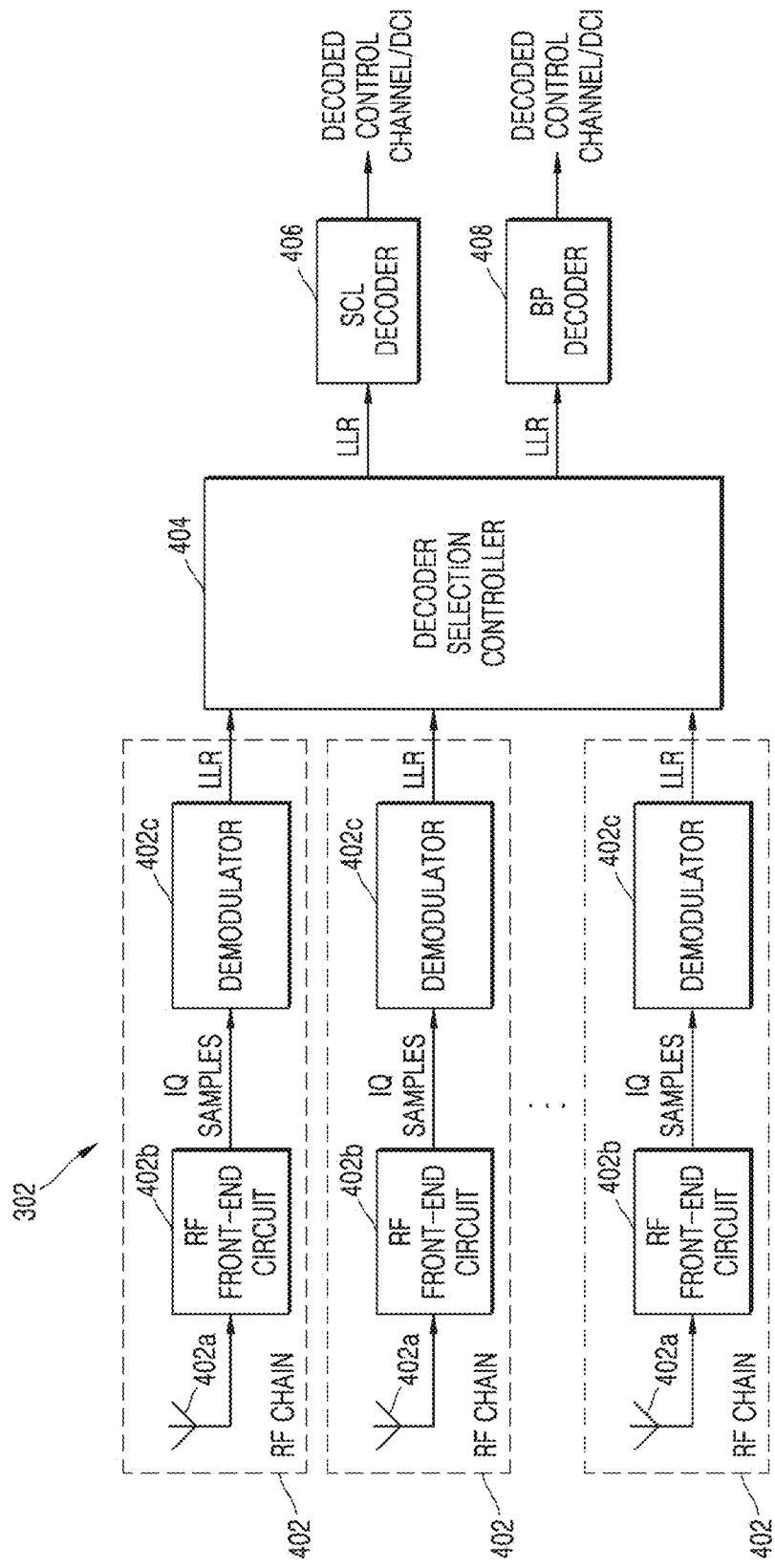
FIG. 3 depicts a receiver of the UE for managing the decoding of the control channels received on the multi-SIMS, according to example embodiments as disclosed herein.

The UE 206 may be configured to decode the control and data channels, on receiving the control and data channels from the BS 202 on the one or more SIMS/CCs. The UE 206 may decode the control channels to obtain the DCI transmitted from the BS 202. The UE 206 may decode the data channels to obtain the data transmitted from the BS 202. The UE 206 may use a Belief Propagation (BP) decoder 408 (as depicted in FIG. 3) for decoding the data channels received on the one or more SIMS. The BP decoder 408 may use the LDPC codes to decode the data channel. Example embodiments herein may use terms such as, but not limited to, "BP decoder", "LDPC decoder", "LDPC BP decoder", and so on interchangeably through the document.

In example embodiments, the UE 206 may use a Successive Cancellation List (SCL) decoder 406 (as depicted in FIG. 3) for decoding the control channel, on receiving the control channel on only one SIM. The SCL decoder 406 may use the polar codes to decode the control channel. Example embodiments herein may use terms such as, but not limited to, "SCL decoder", "polar code decoder", and so on interchangeably through the document.

In example embodiments, the UE 206 may select the decoder for decoding the control channels on each SIM/CC, on receiving the control channels on the multi-SIMS at a time or on determining that the control channels on the multi-SIMS may overlap. The selected decoder may be the SCL decoder 406 or the BP decoder 408. Thereby, mitigating a collision of the control channels by reusing the BP decoder 408 for decoding the control channel.

For selecting the decoder for decoding the control channel, the UE 206 may receive Radio Frequency (RF) signals corresponding to the encoded control channels from the BS 202 on the multi-SIMS. The UE 206 may perform processing of the received RF signals on the multi-SIMS to obtain symbols/codewords. The processing may include, but is not limited to, linear equalization, nonlinear equalization, adaptive filtering, channel estimation, carrier phase recovery, synchronization, polarization recovery, and so on. The obtained symbols may be modulated symbols including real (I) and imaginary (Q) samples (IQ samples). The UE 206 may further perform a demodulation of the obtained symbols on the multi-SIMS to compute Log-Likelihood Ratios (LLRs) for the obtained symbols. The LLRs may be an initial estimate of bits of the obtained symbols corresponding to the multi-SIMS. The demodulation may involve at least one of, but is not limited to, a hard decoding method, a soft decoding method, and/or any other suitable decoding method to generate the LLRs for the obtained symbols.

In example embodiments, on generating the LLR, the UE 206 may measure at least one factor for each of the multi-SIMs based on the LLR computed on (e.g., with respect to) each SIM. Examples of the at least one factor may be, but are not limited to, a channel quality metric, a sum of the LLR, Mean Mutual Information per Bit (MMIB), and so on. Examples of the channel quality metric may be, but are not limited to, a Signal to Interference plus Noise Ratio (SINR), a block error rate (BLER), and so on. The channel quality metric may provide information about channel impairments (for example; interference, noise or the like), which have been introduced into the obtained symbol from the RF signal (e.g., corresponding to the control channel) while receiving from the BS 202. The sum of the LLR may correspond to an addition of the estimated bits of the obtained symbol from the RF signal. In an example, the UE 206 may calculate the SINR using the channel information. The MMIB may provide an estimate of the mutual information between the bits transmitted from the BS 202 and the LLRs estimated from the received signal on the UE 206. The MMIB may be an approximation for a capacity of wireless channel of the at least one RAT between the BS 22 and the UE 206. The mutual information may correspond to a modulation type (for example: 64-Quarature Amplitude Modulation (QAM), 16-QAM, or the like) associated with the obtained symbol from the RF signal. The UE 206 may derive the MMIB from the SINR using a polynomial approximation function known as a J function. The MMIB may be determined using the below equation:

$$I_2 = J(2\sqrt{y})$$

wherein y is the SINR and $I_2$ is the MMIB, wherein $J(x)$, wherein $x=(2\sqrt{y})$ may be approximated as:

$$J(x) = \begin{cases} a_1 x^3 + b_1 x^2 + c_1 x, & \text{if } x \leq 1.6363 \\ 1 - \exp(a_2 x^3 + b_2 x^2 + c_2 x + d_2), & \text{if } 1.6363 \leq x < 7.9999 \\ 1, & \text{if } x \geq 7.9999 \end{cases}$$

wherein, $a_1 = -0.04210661$, $b_1 = 0.209252$, $c_1 = -0.00640081$, $a_2 = 0.00181492$, $b_2 = -0.142675$, $c_2 = -0.0822054$, and $d_2 = 0.0549608$ The UE 206 may compare the measured at least one factor for each SIM with the measured at least one factor for the other SIMS. Based on the comparison, the UE 206 may select the decoder for decoding the control channel on (e.g., corresponding to) each SIM. In example embodiments, the UE 206 may consider a sum and/or combination of the measured factors for selecting the decoder. In example embodiments, the UE 206 may consider only one of the measures factors for selecting the decoder.

In example embodiments, the UE 206 may select the SCL decoder 406 for decoding the control channel on the SIM, if the SIM has a higher (e.g., highest) channel quality metric compared to the channel quality metric measured for the other SIMS. The UE 206 may select the BP decoder 408 for decoding the control channel on the SIM, if the SIM has a lower (e.g., lowest) channel quality metric compared to the channel quality metric measured for the other SIMS.

In example embodiments, the UE 206 may select the SCL decoder 406 for decoding the control channel on the SIM, if the SIM has a higher (e.g., highest) sum of the LLR compared to the LLRs measured for the other SIMs. The UE 206 may select the BP decoder 408 for decoding the control channel on the SIM, if the SIM has a lower (e.g., lowest) sum of the LLR compared to the LLRs measured for the other SIMS.

In example embodiments, the UE 206 may select the SCL decoder 406 for decoding the control channel on the SIM, if the SIM has a higher (e.g., highest) MMIB compared to the MMIB measured for the other SIMS. The UE 206 may select the BP decoder 408 for decoding the control channel on the SIM, if the SIM has a lower (e.g., lowest) MMIB compared to the MMIB measured for the other SIMs.

In example embodiments, the UE 206 may select the SCL decoder 406 for decoding the control channel on the SIM, if the SIM has a higher (e.g., highest) channel quality metric, and/or a higher (e.g., highest) sum of the LLR, and/or a higher (e.g., highest) MIMB compared to the channel quality metric, the LLRs, and/or the MMIB respectively measured for the other SIMS. The UE 206 may select the BP decoder 408 for decoding the control channel on the SIM, if the SIM has a lower (e.g., lowest) channel quality metric, and/or a lower (e.g., lowest) sum of the LLR, and/or a lower (e.g., lowest) MIME compared to the channel quality metric, the LLRs, and/or the MMIB respectively measured for the other SIMS.

The UE 206 may then decode the computed LLR using the selected decoder (the SCL decoder 406 or the BP decoder 408) on each SIM of the multi-SIMs. The decoded LLR may correspond to the decoded control channel including the DCI transmitted by the BS 202. Thus, the SCL decoder 406 and the BP decoder 408 may be used simultaneously or contemporaneously for decoding the control channels received on the multi-SIMS, which further reduces area and power consumption, and mitigates the collision/overlapping of the control channels.

In example embodiments, the SCL decoder 406 may use a constrained breadth-first search method to decode the LLR using the polar codes parameterized by a number of decoding paths (L), which may be tracked by the SCL decoder 406 in parallel. The SCL decoder 406 may output a plurality of sequences (for example: L sequences) of decoded bits by decoding the LLR using the polar codes. The SCL decoder 406 may further select one of the L sequences, which passes a Cyclic Redundancy Check (CRC) as a decoded sequence. The decoded sequence may be a decoded control channel.

In example embodiments, the BP decoder may use a sparse parity check matrix to decode the LLR corresponding to the decoded control channel. The sparse parity check matrix may be a modified factor graph of the polar codes. In an example, the factor graph may be at least one of, but not limited to, a Forney graph, a use factor graph, and so on. The sparse parity check matrix includes small zero non-elements and may be multiplied with the LLR/data bits in order to encode the LLR. The BP decoder may decode the LLR by passing the LLRs between nodes of the modified factor graph of the polar codes. The nodes may be labelled with a pair of integers.

Consider an example scenario, wherein the UE 206 receives the RF signals corresponding to the encoded control channels on a first SIM/CC and a second SIM/CC. In such a case, the UE 206 may process the received RF signals on the first and second SIMs to obtain the symbols (that include the IQ samples) corresponding to the first and second SIMs respectively. The UE 206 may further perform the demodulation of the obtained symbols on the first and second SIMs to compute the LLRs. On computing the LLRs, the UE 206 may measure the factors such as, but not limited to, the SINR, the sum of the LLRs, the MMIB, and so on, for the first and second SIMS. Thereafter, the UE 206 may compare the measured factors associated for the first SIM with the measured factors for the second SIM. Based on the comparison, the UE 206 may select the decoder to decode the control channel on each of the first and second SIMS.

In an example herein, the UE 206 may select the SCL decoder 406 for decoding the control channel on the first SIM and the BP decoder 408 for decoding the control channel on the second SIM, if the first SIM is associated with higher SINR (an example of the channel quality metric) compared to the second SIM.

In another example herein, the UE 206 may select the SCL decoder 406 for decoding the control channel on the first SIM, and the BP decoder 408 for decoding the control channel on the second SIM, if the first SIM is associated with a higher sum of the LLR compared to the second SIM.

In another example herein, the UE 206 may select the SCL decoder 406 for decoding the control channel on the first SIM, and the BP decoder 408 for decoding the control channel on the second SIM, if the first SIM is associated with higher MMIB compared to the second SIM.

FIG. 1 shows example components of the wireless communication system 200, but it is to be understood that example embodiments are not limited thereon. In example embodiments, the wireless communication system 200 may include less or more components. Further, the labels or names of the components are used only for illustrative purposes and do not limit the scope of example embodiments herein. One or more components may be combined together to perform the same or a substantially similar function in the wireless communications system 200.

Figure 2:
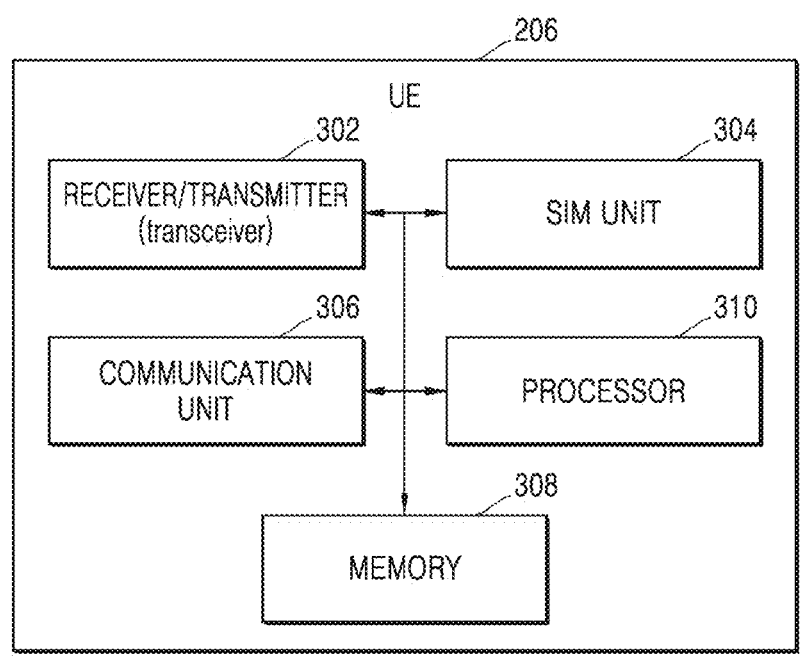
FIG. 2 is a block diagram depicting components of the UE for managing decoding of the control channels received on multiple-SIMS (multi-SIMs), according to example embodiments as disclosed herein.

FIG. 2 is a block diagram depicting components of the UE 206 for managing decoding of the control channels received on the multi-SIMS, according to example embodiments as disclosed herein.

The UE 206 may include a receiver/transmitter (transceiver) 302 (may be referred to as a receiver, a transmitter and/or a transceiver herein), a SIM unit 304, a communication unit 306, a memory 308 and/or a processor 310. The UE 206 may also include storage, a display, Input/Output (I/O) ports, and so on (not shown).

The SIM unit 304 may include (e.g., be configured to provide housing for) one or more SIMS (also referred to herein as the SIMS) operated by the same, similar or different service providers. The SIMs may enable the UE 206 to communicate with at least one external device (such as the BS 206, other UEs, external server, and so on) by supporting the at least one RAT.

The communication unit 306 may be configured to enable the UE 206 to communicate with the at least one external device using an interface supported by the at least one RAT. Examples of the interface may be, but are not limited to, a wired interface, a wireless interface (for example: an air interface, an Nu interface, or the like), a wireless fronthaul interface, a wired or wireless backhaul interface, and/or any structure supporting communications over a wired and/or wireless connection.

The memory 308 may store at least one of the received symbols, the measured factors, and so on. Examples of the memory 308 may be, but are not limited to, NAND, embedded Multi Media Card (eMMC), Secure Digital (SD) cards, Universal Serial Bus (USB), Serial Advanced Technology Attachment (SATA), Solid-State Drive (SSD), and so on. Further, the memory 308 may include one or more computer-readable storage media. The memory 308 may include one or more non-volatile storage elements. Examples of such non-volatile storage elements may include magnetic hard discs, optical discs, floppy discs, flash memories, or forms of Electrically Programmable Read Only Memory (EPROM) or Electrically Erasable and Programmable ROM (EEPROM). In addition, the memory 308 may, in some examples, be considered a non-transitory storage medium. The term "non-transitory" may indicate that the storage medium is not embodied in a carrier wave or a propagated signal. However, the term "non-transitory" should not be interpreted to mean that the memory 308 is non-movable. In certain examples, a non-transitory storage medium may store data that may, over time, change (e.g., in Random Access Memory (RAM) or cache).

The processor 310 may be at least one of, but is not limited to, a single processor, a plurality of processors, multiple homogeneous or heterogeneous cores, multiple Central Processing Units (CPUs) of different kinds, microcontrollers, special media, and/or other accelerators. The processor 310 may be configured to control operations of the receiver 302. The processor 310 may also be configured to receive the data from the receiver 302 and process the data, wherein the data may be received by the receiver 302 from the BS 202 over the data channel.

The receiver 302 may be configured to receive the control and data channels from the BS 202 on the multi-SIMS/CCs, wherein the control and data channels may be encoded channels. The receiver 302 may also be configured to decode the received control and data channels on the multi-SIMS for obtaining the DCI and the data transmitted from the BS 202. In example embodiments, the receiver 302 may select the decoder for decoding the control channels on each SIM.

As depicted in FIG. 3, the receiver 302 may include multiple RF chains 402 for the multi-SIMS supported by the UE 206, a decoder selection controller 404, the SCL decoder 406, and/or the BP decoder 408 for decoding the control channels received on the multi-SIMS. The receiver 302 may also include a single RF chain 402 for the multi-SIMs supported by the UE 206 (not shown).

Each of the multiple RF chains 402 may include an antenna 402a, a RF front-end circuit 402b, and/or a demodulator 402c. The antenna 402a may be configured to receive the RF signal from the BS 202. The received RF signal may correspond to the encoded control channel. The antenna 402a may feed the received RF signal to the RF front-end unit 402b.

The RF front-end circuit 402b may be configured to obtain the symbol/codeword by processing the received RF signal from the antenna 402a. The processing may involve, but is not limited to, pre-processing (such as, but not limited to, band-pass filtering, pre-coding, pre-distortion and so on) linear equalization, nonlinear equalization, adaptive filtering, channel estimation, carrier phase recovery, synchronization, polarization recovery, and so on. The symbol obtained from processing the received RF signal from the antenna 402a may be the modulated symbol including the IQ samples. The RF front-end circuit 402b may feed the obtained symbol to the demodulator 402c.

The demodulator 402c may be configured to demodulate the received symbol from the RF front-end circuit 402b by computing the LLR/initial estimate of bits for the received symbol. In example embodiments, the demodulator 402c may compute the LLR by performing hard decoding on the received symbol. In example embodiments, the demodulator 402c may compute the LLR by performing soft decoding on the received symbol. In example embodiments, the demodulator 402c may compute the LLR by performing a combination of hard decoding and soft decoding on the received symbol. The demodulator 402c may feed the computed LLR to the decoder selection controller 404.

The decoder selection controller 404 may be configured to receive the LLRs from the demodulators 402c of the multiple RF chains 402 associated with the multi-SIMS and select the decoder for decoding the LLRs on each of the multi-SIMS. The decoded LLRs may represent the decoded control channel including the DCI transmitted by the BS 202.

For selecting the decoder, the decoder selection controller 404 may measure the factors for each SIM based on the received LLRs corresponding to each SIM. Examples of the factors may be, but are not limited to, the channel quality metric (for example; the SINR, the BLER, and so on), the sum of the LLRs, the MMIB, and so on. The decoder selection controller 404 may measure the sum of the LLR for each SIM by adding the estimated LLRs of the received symbol from the RF front-end circuit 402b of each SIM. The decoder selection controller 404 may measure the MMIB from the SINR.

In example embodiments, the decoder selection controller 404 may measure the factors for a pre-defined or alternatively, given window (also referred to herein as a time window). The pre-defined or alternatively, given window may be a time duration that is pre-set/pre-defined or alternatively, given by the decoder selection controller 404. In example embodiments, the decoder selection controller 404 may pre-define or determine the window based on a mode/state of the UE 206. The mode/state may be at least one of, but is not limited to, an idle state, a connected state, a mobility state, and/or a CA mode supporting the multiple CCs for the UE 206. In example embodiments, when the UE 206 is in the idle state, the decoder selection controller 404 may define the window based on periodicity of paging, as the UE 206 may receive only the paging in the idle state. In example embodiments, the decoder selection controller 404 may define the window such that the window is smaller, when mobility/speed (e.g., physical movement speed) of the UE 206 is higher. The mobility of the UE 206 may be measured using a number of handovers/Doppler measurements. In example embodiments, when the CA is activated in the UE 206, the decoder selection controller 404 may define the window based on activation timers associated with secondary carriers, which may be supported by the UE 206.

In example embodiments, the decoder selection controller 404 may dynamically vary the window based on a change in the state of the UE 206.

On measuring the factors for the pre-defined or alternatively, given window, the decoder selection controller 404 may average/filter the measured factors for each of the multi-SIMS. The decoder selection controller 404 may average the measured factors by dividing a sum of the measured factors by a total number of SIMs on which the UE 206 has received the control channels. The decoder selection controller 404 may compare the averaged measured factors for each SIM (e.g., averaged over the window) with the averaged measured factors for the other SIMS and may accordingly select the decoder for decoding the control channels on each of the multi-SIMS. In example embodiments, the decoder selection controller 404 may select the decoder by considering a combination of the averaged measured factors for the multi-SIMS. In example embodiments, the decoder selection controller 404 may select the decoder by considering each of the averaged measured factors for the multi-SIMS individually.

For example, the decoder selection controller 404 may select the SCL decoder 406 for the SIM, if the corresponding SIM has higher averaged channel quality metric and/or higher averaged sum of the LLR, and/or higher averaged MIMB with respect to the other SIMS (e.g., averaged over the window). For example, the decoder selection controller 404 may select the BP decoder 408 for the SIM, if the corresponding SIM has a lower averaged channel quality metric and/or lower averaged sum of the LLR, and/or lower averaged MIMB with respect to the other SIMS (e.g., averaged over the window). Thus, the BP decoder 408 and the SCL decoder 406 may be used simultaneously or contemporaneously for the decoding of the control channel, which further mitigates the collision of the control channels by reducing area and power consumption.

Consider an example scenario, wherein the decoder selection controller 404 receives the LLRs from the demodulators 402c of a first, second and third SIMS. The LLRs received from the first, second, and third SIMs may provide the initial estimation of the bits of the symbols corresponding to the encoded control channels received on the first, second and third SIMS, respectively. In such a case, the decoder selection controller 404 may measure the factors (such as the SINR, the sum of the LLR, and/or the MMIB) for each SIM for the pre-defined or alternatively, given window. The decoder selection controller 404 may then average the measured factors for each of the first, second, and third SIMs. The decoder selection controller 404 may compare the averaged measured factors for each SIM with the averaged measured factors for the other SIMs and select the decoder. In an example herein, consider that, the first SIM is associated with a higher averaged SINR (an example of the channel quality metric), a higher sum of the LLR, and a higher averaged MMIB with respect to the second and third SIMS. In such a case, the decoder selection controller 404 may select the SCL decoder 406 for decoding the control channel on the first SIM. In another example herein, consider that, the second SIM is associated with a lower averaged SINR, a lower averaged sum of the LLR, and a lower averaged MMIB with respect to the first and third SIMS. In such a case, the decoder selection controller 404 may select the BP decoder 408 for decoding the control channel on the second SIM. In some embodiments, the decoder selection controller 404 may select a first available decoder among the SCL decoder 406 and the BP decoder 408 for decoding the control channel on the third SIM. The decoder selection controller 404 may further provide the LLR received from each of the multi-SIMs to the selected decoder (e.g., the SCL decoder 406, the BP decoder 408) for the corresponding SIM.

The SCL decoder 406 may be configured to decode the LLR corresponding to at least one SIM of the multi-SIMS (received from the decoder selection controller 404) using the polar codes. The decoded LLR may represent the decoded control channel.

The BP decoder 408 may be configured to decode the LLR corresponding to at least one SIM of the multi-SIMS (received from the decoder selection controller 404) using a sparse parity check matrix. The decoded LLR may represent the decoded control channel. In example embodiments, the sparse parity check matrix may be a modified factor graph of the polar codes. In an example, the sparse parity check matrix may include small zero non-elements and may be multiplied with the LLR/data bits in order to encode the LLR.

FIG. 2 shows example components of the UE 206, but it is to be understood that example embodiments are not limited thereon. In example embodiments, the UE 206 may include less or more components. Further, the labels or names of the components are used only for illustrative purposes and do not limit the scope of example embodiments herein. One or more components may be combined together to perform the same or a substantially similar function in the UE 206.

Figure 4:
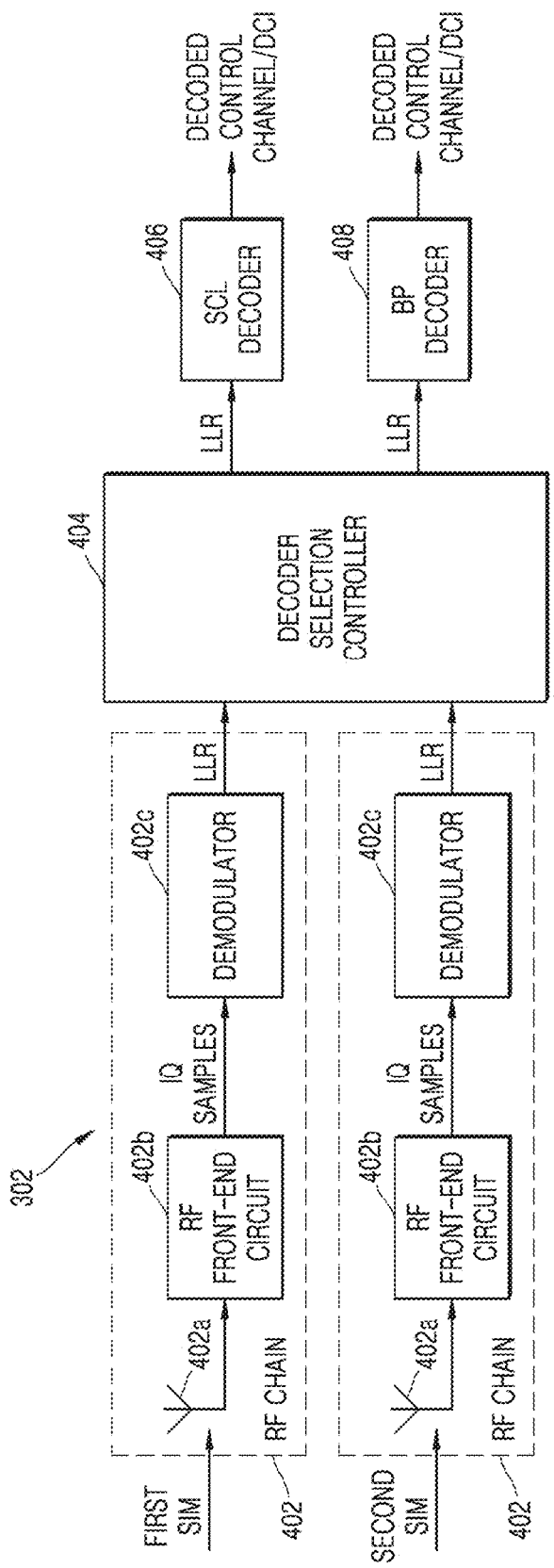
FIG. 4 is an example diagram depicting selection of the decoder for decoding the control channels received on dual SIMS, according to example embodiments as disclosed herein.

FIG. 4 is an example diagram depicting the process of selection of the decoder for decoding the control channels received on dual SIMS, according to example embodiments as disclosed herein.

Consider an example scenario, wherein the UE 206 supports two/dual SIMS (a first SIM, and a second SIM) of different RATs. The UE 206 may include separate RF chains 402 including the antenna 402a, the RF front-end circuit 402b, and/or the demodulator 402c for the first and second SIMS.

The antennas 402a may receive the RF signals from the at least one BS 202 on the corresponding first and second SIMS. The antennas 402 may feed the received RF signals to their respective RF front-end circuits 402b. The RF front-end circuits 402b may process the received RF signals and obtain the modulated symbols including the IQ samples from the received RF signals. The RF front-end circuits 402b may feed the obtained modulated symbols corresponding to the first and second SIMs to their respective demodulators 402c. The demodulators 402c may demodulate the received modulated symbols to compute the LLRs/initial estimate of the bits for the symbols. The demodulators 402c may feed the computed LLRs corresponding to the first and second SIMS to the decoder selection controller 404.

The decoder selection controller 404 may receive the LLRs corresponding to the first and second SIMS and select the decoder for decoding the LLRs on the first and second SIMS based on the received LLRs. The decoded LLRs may represent the decoded control channels. The decoder selection controller 404 may measure factors such as, but not limited to, the SINR/channel quality metric, the sum of the LLR, the MIMB, and so on, based on the received LLRs for the pre-defined or alternatively, given window. The decoder selection controller 404 may then average the measured factors over the pre-defined or alternatively, given window. The decoder selection controller 404 may compare the averaged measured factors for the first SIM with the measured factors for the second SIM. Based on the comparison, the decoder selection controller 404 may select the decoder to decode the control channels on each of the first and second SIMS.

In an example herein, the decoder selection controller 404 may select the SCL decoder 406 for decoding the control channel on the first SIM and the BP decoder 408 for decoding the control channel on the second SIM, if the first SIM is associated with a higher SINR, a higher sum of LLRs and/or a higher MIMB with respect to the second SIM.

The decoder selection controller 404 may provide the LLR corresponding to the first SIM to the selected SCL decoder 406. The SCL decoder 406 may use the polar codes for decoding the LLR received on the first SIM to obtain the control channel including the DCI, which has been transmitted by the BS 202. The decoder selection controller 404 may provide the LLR corresponding to the second SIM to the selected BP decoder 408. The BP decoder 408 may use the sparse parity matrix (the modified form of the polar codes) for decoding the LLR received on the second SIM to obtain the control channel including the DCI, which has been transmitted by the BS 202.

Figure 5:
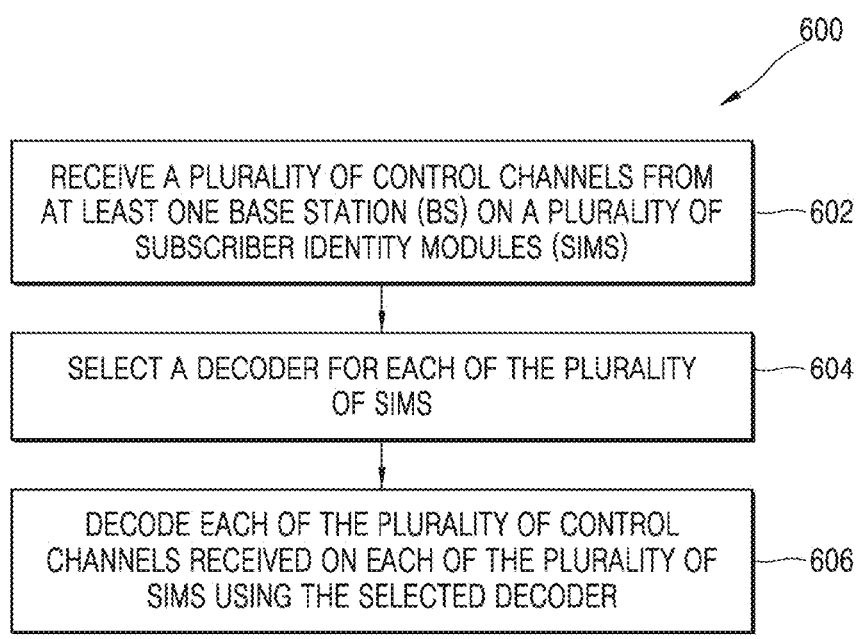
FIG. 5 is a flow diagram depicting a method for managing decoding of the control channels on the UE supporting the multi-SIMS, according to example embodiments as disclosed herein.

FIG. 5 is a flow diagram 600 depicting a method for managing decoding of the control channels on the UE 206 supporting the multi-SIMs, according to example embodiments as disclosed herein.

At operation 602, the method may include receiving, by the UE 206, a plurality of control channels from the at least one BS 206 on the multi-SIMS/plurality of SIMs. The received control channels may be encoded control channels including the DCI.

At operation 604, the method may include selecting, by the UE 206, the decoder for each of the multi-SIMS. The UE 206 may select the decoder from among the SCL decoder (406) and/or the BP decoder (408) for each of the multi-SIMs based on the at least one factor associated with each of the multi-SIMs. The at least one factor may include the channel quality metric, the sum of the LLRs, and/or the MMIB.

At operation 606, the method may include decoding, by the UE (206), each of the plurality of control channels received on each of the multi SIMs using the selected decoder (e.g., selected for each of the multi-SIMs).

The various operations in method 600 may be performed in the order presented, in a different order, simultaneously or contemporaneously. Further, in example embodiments, some operations listed in FIG. 5 may be omitted.

Figure 6A:
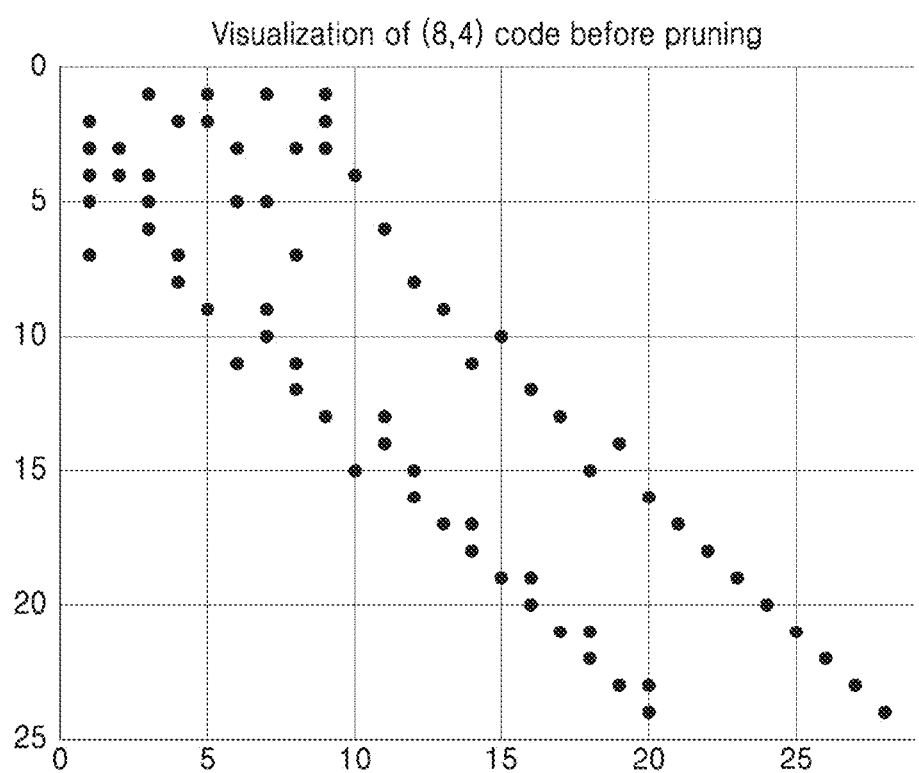
FIGS. 6A-6B are example diagrams depicting generation of the sparse parity check matrix for the BP decoder, according to example embodiments as disclosed herein.
Figure 6B:
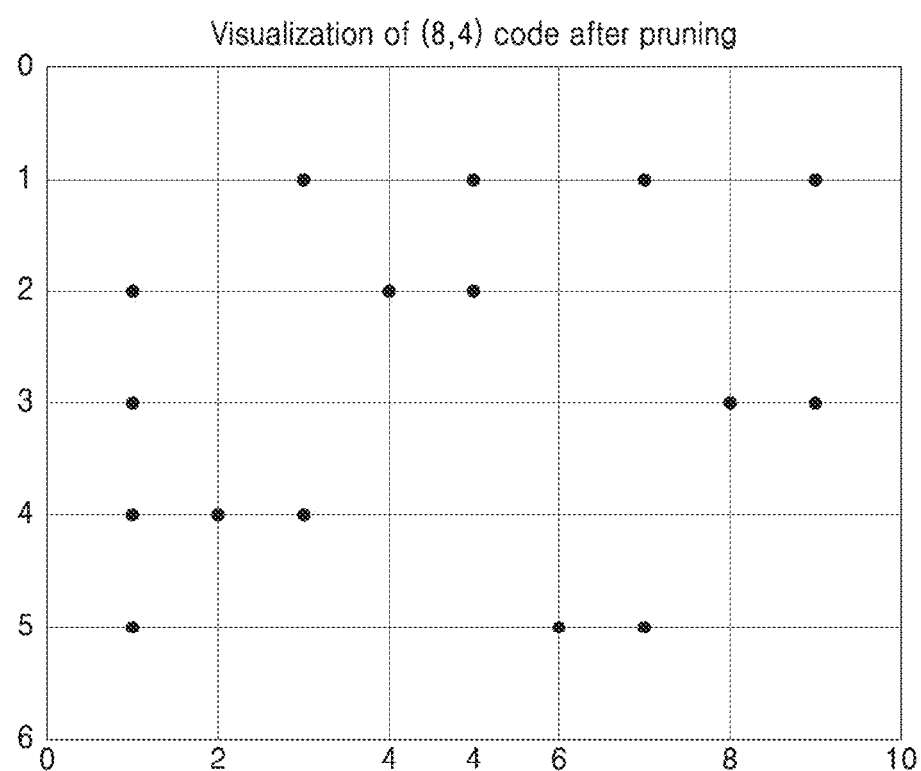

FIGS. 6A and 6B are example diagrams depicting generation of the sparse parity check matrix for the BP decoder 408, according to example embodiments as disclosed herein. The sparse parity check matrix may be the modified factor graph/parity matrix of the polar codes. The sparse parity check matrix may include small zero non-elements and may be multiplied with the LLR/data bits in order to encode the LLR. An example parity matrix of the polar codes for (8, 4) code is depicted in FIG. 6A. The (8, 4) code may indicate a number of coded and uncoded bits. The example parity matrix may include non-zero values (that is indicated by stars in FIG. 6A) and zero values (positions other than indicated by the stars). In an example, the sparse parity check matrix may be generated by applying a pruning method on the example parity matrix. The generated sparse parity check matrix is depicted in FIG. 6B. The sparse parity check matrix includes small non-zero elements (indicated by stars in FIG. 6B), compared to the parity check matrix of polar codes. The sparse parity check matrix may be used by the BP decoder 408 for decoding the polar codes.

Example embodiments herein enable a Successive Cancellation List (SCL) decoder and a Belief Propagation (BP) decoder to decode the control channels on multiple Subscriber Identity Modules (multi-SIMS) simultaneously or contemporaneously, which may reduce decoding time and/or mitigate collisions/overlapping of the control channels.

Example embodiments herein provide selecting the SCL decoder or the BP decoder for decoding the control channels on each of the multi-SIMS. The SCL decoder or the BP decoder may be selected using at least one of a channel quality metric based decoder selection logic, a Log-Likelihood Ratio (LLR) sum based decoder selection logic, and/or a mean mutual information per bit (MMIB).

Example embodiments herein provide reusing the BP decoder to decode the control channel on the SIM (e.g., in addition to decoding the data channel), when its control channel overlaps in time with another SIM (e.g., based on detecting an overlap in decoding times for decoding control channels of two different SIMs), wherein the BP decoder may use a modified form of polar codes to decode the control channel.

Example embodiments disclosed herein may be implemented through at least one software program running on at least one hardware device and performing network management functions to control the elements. The elements shown in FIGS. 1-3 may be at least one of a hardware device, or a combination of hardware device and software module.

Example embodiments disclosed herein describe methods and systems for managing decoding of control channels on a User Equipment (UE) supporting multi-Subscriber Identity Modules (multi-SIMs). Therefore, it is understood that the scope of the protection is extended to such a program and in addition to a computer readable means having a message therein (e.g., stored instructions), such computer readable storage means containing program code means for implementation of one or more operations of the method, when the program runs on a server, a mobile device or any suitable programmable device. The method may be implemented in example embodiments through or together with a software program written in e.g. Very high speed integrated circuit Hardware Description Language (VHDL), another programming language, or implemented by one or more VHDL, or several software modules being executed on at least one hardware device. The hardware device may be any kind of portable device that may be programmed. The device may also include means which could be e.g. hardware means like e.g. an Application-Specific Integrated Circuit (ASIC), or a combination of hardware and software means, e.g. an ASIC and a Field Programmable Gate Array (FPGA), or at least one microprocessor and at least one memory with software modules located (e.g., stored) therein. Example embodiments described herein could be implemented partly in hardware and partly in software. Example embodiments may be implemented on different hardware devices, e.g. using a plurality of CPUs.

Conventional multi-SIM devices and methods for decoding a control channel decode the control channel using an SCL decoder, with a BP decoder being used only for decoding a data channel. In conventional multi-SIM devices containing a single SCL decoder for use by all of the SIMS, control channel information for different SIMS may be received simultaneously or contemporaneously, resulting in a bottleneck at the SCL decoder. Accordingly, conventional multi-SIM devices containing a single SCL decoder experience excessive delay in decoding the control channels of the respective SIMs. Conventional multi-SIM devices containing multiple SCL decoders for use by the SIMS are more expensive, use an excessive amount of space, and/or consume an excessive amount of power.

However, example embodiments provide improved multi-SIM devices and methods for using both the BP decoder and the SCL decoder for decoding the control channels of SIMS received simultaneously or contemporaneously. Accordingly, the improved multi-SIM devices reduce the delay in decoding the control channels of respective SIMs. Also, the improved multi-SIM devices do not include multiple SCL decoders for use by the SIMS and, thus, avoid or reduce the excessive costs, space utilization and/or power consumption of the conventional multi-SIM devices containing multiple SCL decoders.

According to example embodiments, operations described herein as being performed by the wireless communication system 200, the at least one Base Station 202, the at least one Core Network (CN) 204, the at least one UE 206, the receiver/transmitter (transceiver) 302, the communication unit 306, the processor 310, the RF chains 402, the decoder selection controller 404, the SCL decoder 406, the BP decoder 408, the RF front-end circuit 402b, and/or the demodulator 402c may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing description of example embodiments will so fully reveal the general nature of example embodiments herein that others may, by applying current knowledge, readily modify and/or adapt for various applications such example embodiments without departing from the generic concepts, and, therefore, such adaptations and modifications should and are intended to be comprehended within the meaning and range of equivalents of example embodiments. It is to be understood that the phraseology or terminology employed herein is for the purpose of description and not of limitation. Therefore, while example embodiments herein have been described, those skilled in the art will recognize that example embodiments herein may be practiced with modification within the scope of example embodiments as described herein.

We claim:

1. A method for decoding a plurality of control channels, the method comprising:
    receiving, by a controller, the plurality of control channels from at least one Base Station (BS), the plurality of control channels corresponding to a plurality of Subscriber Identity Modules (SIMs);
    selecting, by the controller, a respective decoder for each of the plurality of SIMS, the respective decoder being among a plurality of decoders, each of the plurality of decoders corresponding to a different decoder type; and
    decoding, by the plurality of decoders, each respective control channel among the plurality of control channels using the respective decoder for a respective SIM among the plurality of SIMs, the respective SIM corresponding to the respective control channel.

2. The method of claim 1, wherein each of the plurality of control channels is an encoded control channel including Downlink Control Information (DCI).

3. The method of claim 1, wherein the selecting the respective decoder selects the respective decoder from among a Successive Cancellation List (SCL) decoder and a Belief Propagation (BP) decoder.

4. The method of claim 1, wherein the selecting the respective decoder comprises:
    obtaining a plurality of symbols from a plurality of Radio Frequency (RF) signals, the plurality of RF signals being received from the at least one BS, and the plurality of symbols corresponding to the plurality of SIMs;
    computing a plurality of Log-Likelihood Ratios (LLRs) by demodulating the plurality of symbols, each LLR among the plurality of LLRs corresponding to a different SIM among the plurality of SIMs;
    measuring at least one factor for each of the plurality of SIMs over a time window based on a respective LLR among the plurality of LLRs;
    averaging the at least one factor over the time window for each of the plurality of SIMs to obtain a respective averaged at least one factor for each of the plurality of SIMs; and
    selecting the respective decoder for each of the plurality of SIMs based on the respective averaged at least one factor for each of the plurality of SIMs.

5. The method of claim 4, wherein the at least one factor includes at least one of a channel quality metric, a sum of the LLR, or Mean Mutual Information per Bit (MMIB).

6. The method of claim 4, wherein the time window is a time duration based on a state of a user equipment (UE), the state including at least one of an idle state, a connected state, a mobility state, or a Carrier Aggregation (CA) enabled state, and the UE including the controller and the plurality of decoders.

7. The method of claim 4, wherein selecting the respective decoder for each of the plurality of SIMs based on the respective averaged at least one factor for each of the plurality of SIMs comprises:

comparing the respective averaged at least one factor for a first SIM among the plurality of SIMs with the respective averaged at least one factor for a second SIM among the plurality of SIMs;

selecting a SCL decoder for the first SIM in response to the respective averaged at least one factor for the first SIM having higher values than the respective averaged at least one factor for the second SIM; and selecting a BP decoder for the first SIM in response to the respective averaged at least one factor for the first SIM having lower values than the respective averaged at least one factor for the second SIM.

8. The method of claim 7, wherein the decoding each respective control channel among the plurality of control channels comprises:

decoding each LLR among the plurality of LLRs using one of the SCL decoder or the BP decoder.

9. The method of claim 8, wherein the SCL decoder is configured to decode the respective LLR among the plurality of LLRs using polar codes.

10. The method of claim 8, wherein the BP decoder is configured to decode the respective LLR among the plurality of LLRs using a sparse parity check matrix, the sparse parity check matrix being a modified factor graph of polar codes.

11. A device comprising:

a controller configured to
receive a plurality of control channels from at least one Base Station (BS), the plurality of control channels corresponding to a plurality of Subscriber Identity Modules (SIMs), and
select a respective decoder for each of the plurality of SIMs; and a plurality of decoders including the respective decoder, each of the plurality of decoders corresponding to a different decoder type, and the plurality of decoders being configured to decode each respective control channel among the plurality of control channels using the respective decoder for a respective SIM among the plurality of SIMs, the respective SIM corresponding to the respective control channel.

12. The device of claim 11, wherein the respective decoder is one of a Successive Cancellation List (SCL) decoder or a Belief Propagation (BP) decoder.

13. The device of claim 11, wherein the device further comprises:
at least one Radio Frequency (RF) front-end circuit configured to obtain a plurality of symbols from a plurality of RF signals, the plurality of RF signals being received from the at least one BS, and the plurality of symbols corresponding to the plurality of SIMs, and
at least one demodulator configured to compute a plurality of Log-Likelihood Ratios (LLRs) by demodulating the plurality of symbols, each LLR among the plurality of LLRs corresponding to a different SIM among the plurality of SIMs; and
the controller is configured to
measure at least one factor for each of the plurality of SIMs over a time window based on a respective LLR among the plurality of LLRs,
average the at least one factor over the time window for each of the plurality of SIMs to obtain a respective averaged at least one factor for each of the plurality of SIMs, and
select the respective decoder for each of the plurality of SIMs based on the respective averaged at least one factor for each of the plurality of SIMs.

14. The device of claim 13, wherein the at least one factor includes at least one of a channel quality metric, a sum of the LLR, or Mean Mutual Information per Bit (MMIB).

15. The device of claim 14, wherein the time window is a time duration based on a state of a user equipment (UE), the state including at least one of an idle state, a connected state, a mobility state, or a Carrier Aggregation (CA) enabled state, and the UE including the device.

16. The device of claim 14, wherein the controller is configured to:

compare the respective averaged at least one factor for a first SIM among the plurality of SIMs with the respective averaged at least one factor for a second SIM among the plurality of SIMs;

select a SCL decoder for the first SIM in response to the respective averaged at least one factor for the first SIM having higher values than the respective averaged at least one factor for the second SIM; and select a BP decoder for the first SIM in response to the respective averaged at least one factor for the first SIM having lower values than the respective averaged at least one factor of the second SIM.

17. The device of claim 16, wherein the plurality of decoders are configured to:

decode each LLR among the plurality of LLRs on using one of the SCL decoder or the BP decoder.

18. The device of claim 17, wherein the SCL decoder is configured to decode the respective LLR among the plurality of LLRs using polar codes.

19. The device of claim 18, wherein the BP decoder is configured to decode the respective LLR among the plurality of LLRs using a sparse parity check matrix, the sparse parity check matrix being a modified factor graph of polar codes.

20. A device comprising:

a plurality of decoders including a Successive Cancellation List (SCL) decoder and a Belief Propagation (BP) decoder, each of the plurality of decoders corresponding to a different decoder type; and a controller configured to
receive a plurality of control channels from at least one Base Station (BS), the plurality of control channels corresponding to a plurality of Subscriber Identity Modules (SIMs), and
select a respective decoder for each of the plurality of SIMs, the respective decoder being among the plurality of decoders, wherein the plurality of decoders is configured to decode each respective control channel among the plurality of control channels using the respective decoder for a respective SIM among the plurality of SIMs, the respective SIM corresponding to the respective control channel.

* * * * *